United States Patent [19]

Shimizu et al.

[11] Patent Number: 5,572,043
[45] Date of Patent: Nov. 5, 1996

[54] SCHOTTKY JUNCTION DEVICE HAVING A SCHOTTKY JUNCTION OF A SEMICONDUCTOR AND A METAL

[75] Inventors: Hitoshi Shimizu; Yoshiyuki Hirayama; Michinori Irikawa, all of Yokohama, Japan

[73] Assignee: The Furukawa Electric Co., Ltd., Tokyo, Japan

[21] Appl. No.: 441,640

[22] Filed: May 15, 1995

Related U.S. Application Data

[63] Continuation of Ser. No. 139,694, Oct. 22, 1993, abandoned.

[30] Foreign Application Priority Data

Oct. 22, 1992 [JP] Japan .................... 4-308189

[51] Int. Cl.$^6$ .................... H01L 29/06; H01L 31/0328; H01L 27/095
[52] U.S. Cl. .................... 257/18; 257/15; 257/185; 257/191; 257/472; 257/473
[58] Field of Search .................... 257/15, 18, 185, 257/191, 472, 473, 184, 189

[56] References Cited

U.S. PATENT DOCUMENTS 4,616,241 10/1986 Biefeld et al. .................... 257/18
5,115,294 5/1992 Sudbo et al. .................... 257/187

FOREIGN PATENT DOCUMENTS 4372178 12/1992 Japan .

OTHER PUBLICATIONS

Electronics Letters, vol. 14, No. 23, 1978.
IEEE Electron Device Letters, vol. Edl.1, No. 9, 1980.
Appl. Phys. Lett. 54(19), 1989.
Appl. Phys. Lett. 55(18), 1989.

*Primary Examiner*—Mahshid Saadat
*Attorney, Agent, or Firm*—Jacobson, Price, Holman & Stern, PLLC

[57] ABSTRACT

To provide a Schottky junction device having a super-lattice arranged in the Schottky interface in order to secure a high Schottky barrier and at the same time showing a high speed response by resolving the phenomenon of piled-up holes at the upper edge of the valence band, while maintaining the height of the Schottky barrier. A Schottky junction device having a Schottky junction of a semiconductor and a metal and a superlattice on the interface of the semiconductor and the metal, wherein the upper edge of the valence band of said superlattice is varied to show a turn to a specific direction. The phenomenon of hole-piling up at the upper end of the valence band is resolved while maintaining the height of the Schottky barrier and consequently such a Schottky junction device shows an excellent high speed response.

7 Claims, 4 Drawing Sheets

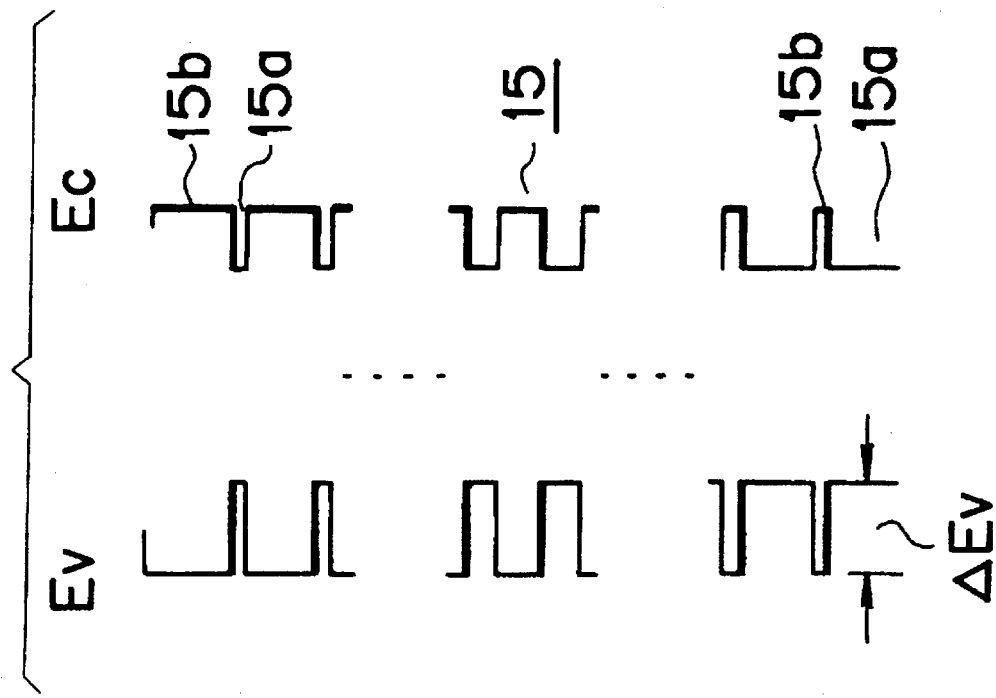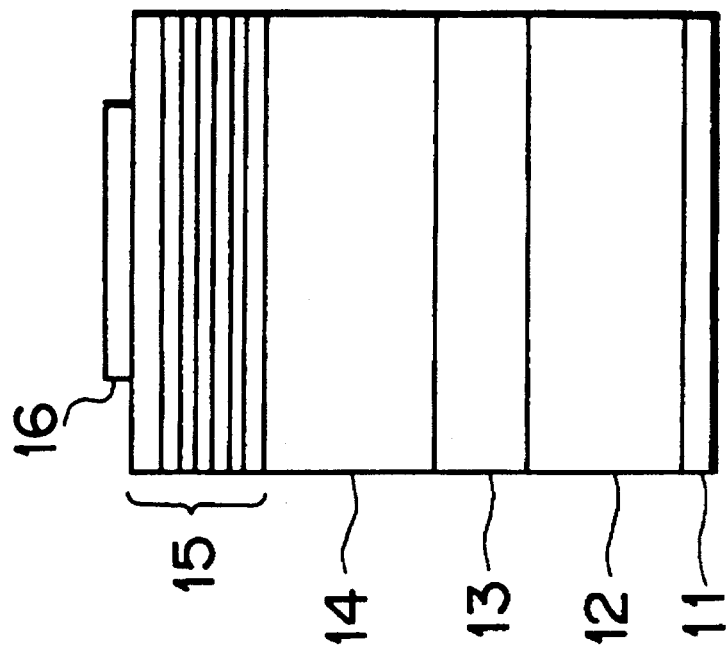

CONTINUOUS

CURVED − 1

CURVED − 2

SCHOTTKY JUNCTION DEVICE HAVING A SCHOTTKY JUNCTION OF A SEMICONDUCTOR AND A METAL

This application is a continuation of application Ser. No. 08/139,694, filed Oct. 22, 1993, now abandoned.

DETAILED DESCRIPTION OF THE INVENTION

1. The Field of Industrial Use

The present invention relates to a Schottky junction device having a Schottky junction of a semiconductor and a metal.

2. Prior Art

As well known in the field of semiconductor technology, $In_{0.53}Ga_{0.47}As$ lattice-match to InP and has a number of remarkable properties including a high mobility in a low electric field, a high saturation velocity, a band gap as small as 0.74 eV and the ability to absorb light with a 1.3 to 1.65 µm wavelength region to be used for optical telecommunications.

In an attempt to prepare semiconductor devices that can fully exploit these properties, there have been proposed MESFETs and photodiodes having a Schottky junction of $In_{0.53}Ga_{0.47}As$ and metal. However, these Schottky junction devices are accompanied by disadvantages such as a low barrier height and a high leakage current.

Techniques for solving these problems are discussed in Reference Documents 1 through 4 listed below.
Reference Document 1

D. V. Morgan et al., Electron. Lett, 14,737 (1978).

This paper proposes the use of an $SiO_2$ layer on the interface of a Schottky junction.
Reference Document 2

J. Barrard et al., IEEE Electron Device Lett. EDL-1,174 (1980).

The above identified document proposes the use of an n-$In_{0.52}Al_{0.48}As$ layer as a contact layer of a Schottky junction.
Reference Document 3

D. H. Lee et al., Appl. Phys. Lett. 19,1863 (1989).

This document, or Reference Document 3, discusses the use of a graded superlattice consisted of $In_{0.53}Ga_{0.47}As/In_{0.52}Al_{0.48}As$ on the interface of a Schottky junction.

As illustrated in FIGS. 3(a) and 3(b) of the accompanying drawings, a device disclosed in Reference Document 3 comprises an Au/Ge—Ni ohmic electrode 11, $n^+$-InP substrate 12, a 0.5 µm thick $n^+$-$In_{0.53}Ga_{0.47}As$ layer 13, a 1.5 µm thick n-$In_{0.53}Ga_{0.47}As$ layer 14, a graded superlattice 15 and an Au Schottky electrode 16.

The graded superlattice 15 of the above described device is formed by alternately laying $In_{0.53}Ga_{0.47}As$ film layers 15a and $In_{0.52}Al_{0.48}As$ film layers 15b to produce a multilayer structure and the thickness of the $In_{0.53}Ga_{0.47}As$ film layers 15a and that of the $In_{0.52}Al_{0.48}As$ film layers 15b are gradually increased in opposite directions.

With a device of Reference Document 3, the height of the Schottky barrier for the Au Schottky electrode is improved to show a value of approximately 0.71 eV from the ordinary value 0.2 eV. for InGaAs bulk layer.

This improvement in the height of Schottky barrier is explained in terms of the effective band gap of the contact layer which is increased due to the average composition of the graded superlattice.

Reference Document 4

U.S. patent application Ser. No. 08/057,757 filed May 7, 1993 based on Japanese Patent Application No. 143420 filed May 8, 1992, Irikawa and Iga.

The above document discloses the use of an InGaAs/InAlAs multiple quantum barrier layer on the interface of a Schottky junction.

With a device of Reference Document 4, the height of the Schottky barrier relative to the Au Schottky electrode is improved to show a value of approximately 1.71 eV from the ordinary value of 0.2 eV.

PROBLEMS TO BE SOLVED BY THE INVENTION

When a graded superlattice or a multiple quantum barrier layer is used on the interface of a Schottky junction, the upper end of the valence band of such a superlattice is varied to show a rugged profile.

When holes run from the semiconductor toward the metal in a Schottky junction device having such a superlattice, they are apt to be piled up on the protruding areas of the upper end of the valence band caused by the valence band discontinuity each having a value of $\Delta Ev$ to obstruct any quick response actions of the device.

OBJECT OF THE INVENTION

In view of the above identified technological problems, it is therefore an object of the present invention to provide a Schottky junction device having a superlattice arranged on the Schottky interface in order to hold a high Schottky barrier and at the same time showing a high speed responsivity by resolving the phenomenon of hole-piling up due to the valence band edge discontinuity, while maintaining the height of the Schottky barrier.

MEANS FOR ACHIEVING THE OBJECT

According to the present invention, the above object is achieved by providing a Schottky junction device having a Schottky junction of a semiconductor and a metal and a superlattice at the interface of the semiconductor and the metal characterized in that the valence band edge of said superlattice is varied gradually to show a specific direction.

Said turn at the upper end of the valence band of said superlattice may be in form of a profile gradually stepped, or changed continuously or curved.

Said superlattice is realized by giving tensile-strained layers and compressive-strained layers to a multilayer structure.

Specifically, said superlattice may be realized by alternately laying tensile-strained layers and compressive-strained layers to a multilayer structure.

Said superlattice may be on an InP substrate and the tensile-strained layers of the superlattice may be made of GaInAs and/or GaAsSb where the compressive-strained layers of superlattice may be made of AlInAs.

FUNCTION

A Schottky junction device according to the invention has a superlattice arranged at the interface of a Schottky junction of a semiconductor and a metal and the valence band edge of said superlattice is varied to show a gradual change to a specific direction.

Such a superlattice shows not only a low leak current and is free from the phenomenon of piled up holes because the valence band edge does not have any protruding areas. Hence, the device shows an excellent high speed response.

BRIEF DESCRIPTION OF THE DRAWINGS

FIG. 3(a) is a schematic sectional view of a conventional Schottky diode.

FIG. 3(b) is a schematic illustration of the energy band diagram of the superlattice of the Schottky diode of FIG. 3(a).

EMBODIMENT

Now, the present invention will be described by referring to the accompanying drawings that illustrate a preferred embodiment of the invention.

Figure 1A:
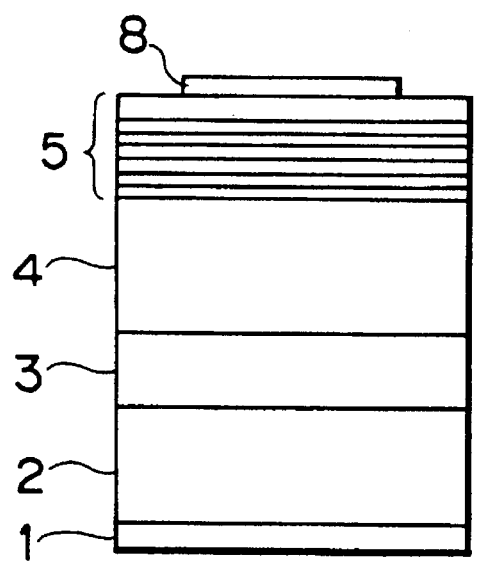
FIG. 1(a) is a schematic sectional view of a preferred embodiment of Schottky junction device of the invention, which is a Schottky diode.

FIG. 1(a) schematically illustrate the embodiment, which is a semiconductor device comprising Schottky diodes and realized by modifying a device disclosed in Reference Document 3 as cited above.

The device of FIG. 1(a) comprises an Au/Ge—Ni ohmic electrode 1, an n$^+$InP substrate 2, a 0.5 μm thick n$^+$-In$_{0.53}$Ga$_{0.47}$As layer 3, a 1.5 thick n-In$_{0.53}$Ga$_{0.47}$As layer 4, a superlattice 5 and an Au Schottky electrode 8.

Figure 1B:
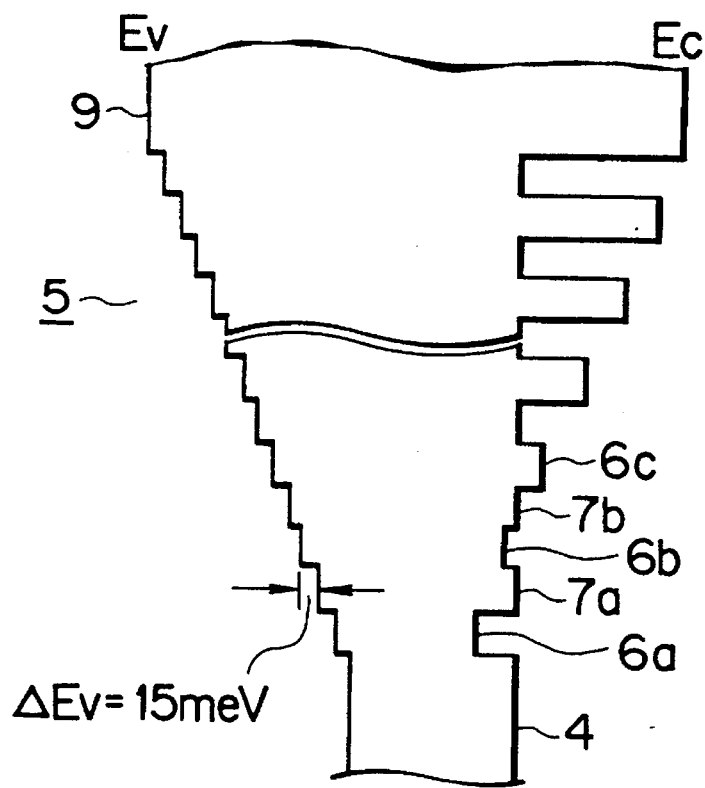
FIG. 1(b) is a schematic illustration of the energy band diagram of the superlattice of the embodiment of Schottky junction device of FIG. 1(a).

As clearly shown in FIG. 1(b), the superlattice 5 of the above device is formed by alternately growing compressive-strained layers 6a, 6b, ... and tensile-strained layers 7a, 7b, ... to produce a multilayer structure between the n-In$_{0.53}$Ga$_{0.47}$As layer 4 and the Au Schottky electrode 8, the total number of the compressive and tensile-strained layers being fifteen, each having a thickness of approximately 4 nm.

Said multilayer structure is so arranged that the strains of the compressive-strained layers 6a, 6b, ... and that of the tensile-strained layers 7a, 7b, ... are compensated so that the strain produces no dislocations in the superlattice 5.

Referring to FIG. 1(b), it will be seen that each of the valence band edge discontinuities ΔEv has a value of 15 meV to show a stepped profile at the upper edge of the valence band.

Figure 2:
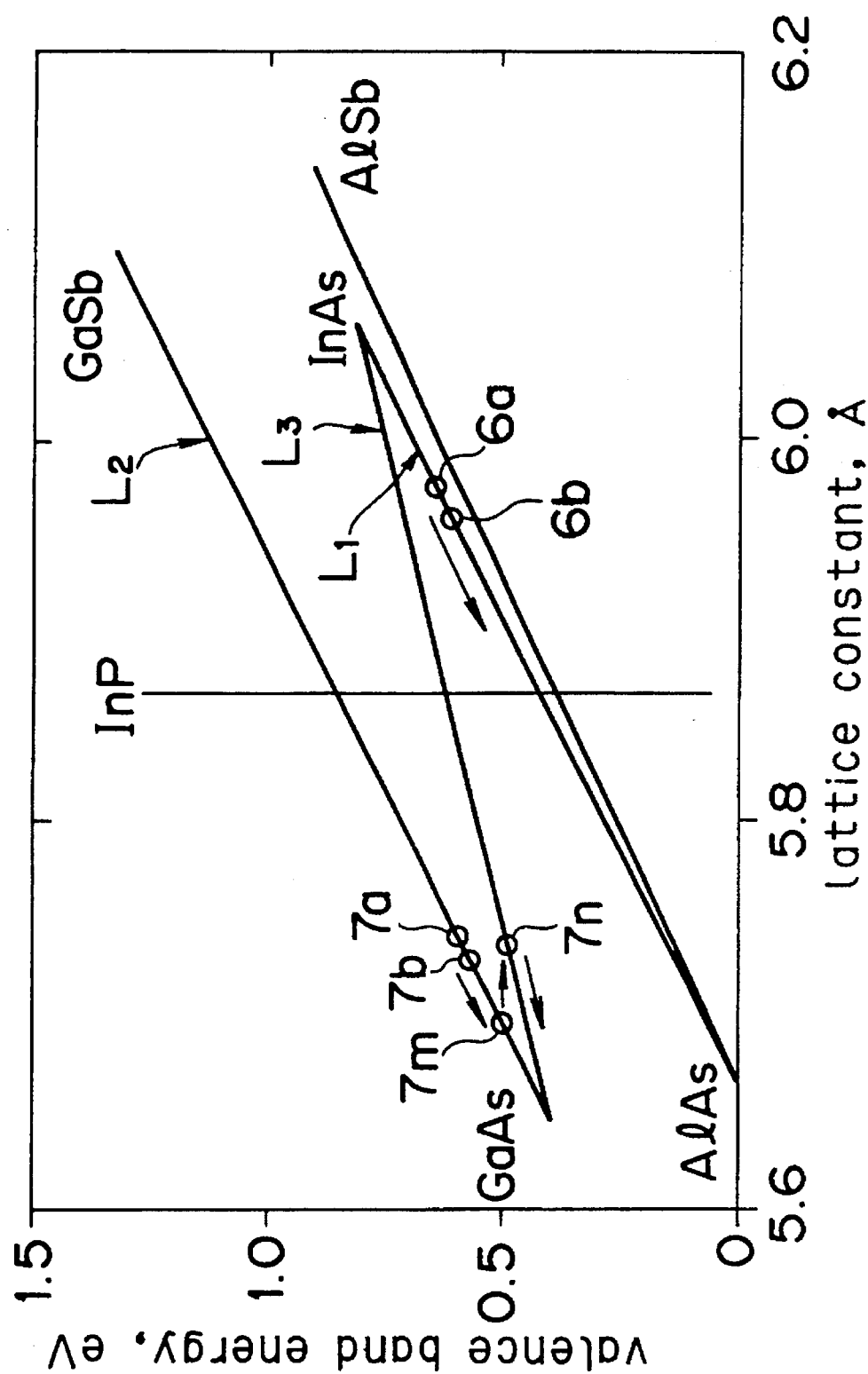
FIG. 2 is a graph showing the relationship between the lattice constant and the valence band energy level of a III–V group semiconductor.
Figure 4A:
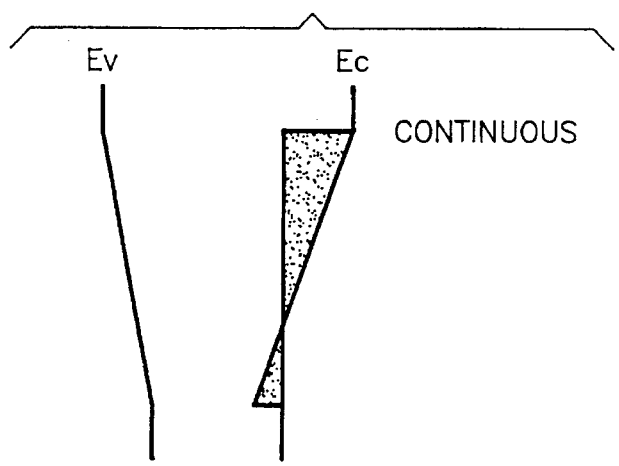
FIG. 4 illustrates the continuous and the curved profile of the upper edge of the valence band of the superlattice.
Figure 4B:
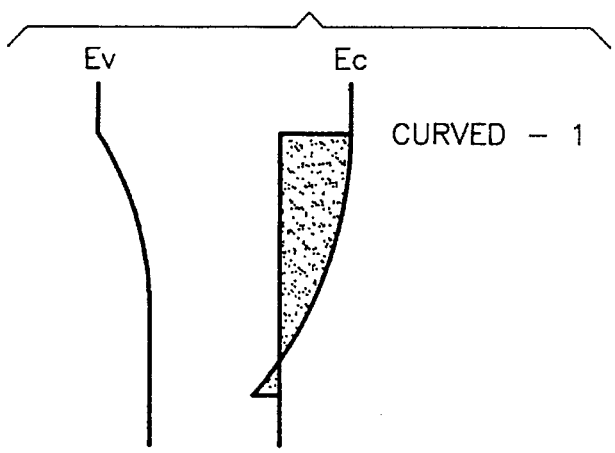
Figure 4C:
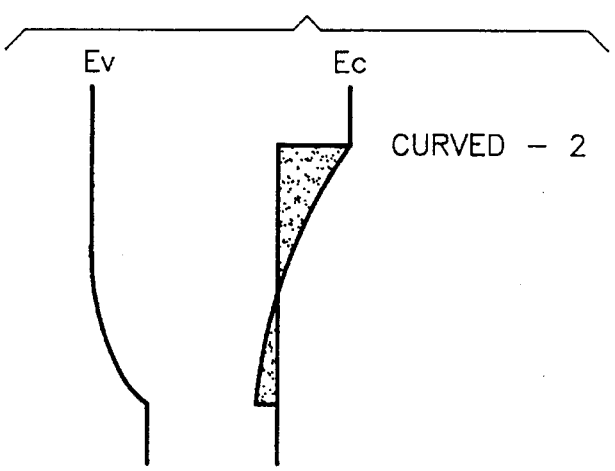

In general, the valence band energy levels and the lattice constants of GaAsSb, GaInAs, AlInAs or AlAsSb show a relationship as described in detail in Reference Document 5 as listed below and illustrated in FIG. 2. if AlAs is used as reference.
Reference Document 5
F. L. Schuermeyer et al., Appl. Phys. Lett. 55, 1877 (1989).

The compositions of each of the compressive-strained layers 6a, 6b, ... and the tensile-strained layers 7a, 7b, ... of a Schottky junction device according to the invention are defined in terms of the relationship as described in Reference Document 5.

More specifically, the compressive-strained layer 6a which is held in contact with the n-In$_{0.53}$Ga$_{0.47}$As layer 4 that lattice-matches with InP has a composition of Al$_{0.25}$In$_{0.75}$As and the tensile-strained layer 7a arranged next to the compressive-strained layer 6a has a composition of GaAs$_{0.76}$Sb$_{0.24}$, where ΔEv between the layers 6a and 7a having a value of 15 meV. Then, each of the remaining layers is so formed as to show 15 meV for ΔEv by modifying the composition of the compressive-strained layers 6b, ... in the direction from InAs to AlAs along Line L$_1$ and that of the tensile-strained layers 7b, ... in the direction from GaSb to GaAs along Line L$_2$.

With such an arrangement, the compressive-strained layers 6a, 6b, ... having a lattice constant greater than that of InP are subjected to an in-plane compressive strain, whereas the tensile-strained layers 7a, 7b, ... having a lattice constant smaller than that of InP are subjected to an in-plane tensile strain.

Further, in order to avoid the introduction of the dislocation, the compressive-strained layers and the tensile-strained layers are balanced by the same amount.

Note that InGaAs is used in place of GaAsSb for the tensile-strained layers 7n, 7o, ... arranged behind the tensile-strained layer 7m which has a composition of GaAs$_{0.8}$Sb$_{0.2}$.

That is, the composition of the tensile-strained layer 7n will be In$_{0.4}$Ga$_{0.6}$As and the composition of the following tensile-strained layers will be modified in the direction from InAs to GaAs along Line L$_3$.

Finally, an n-In$_{0.52}$Al$_{0.48}$As layer 9 that lattice-matches to InP is laid thereon to contact with the Au Schottky electrode 8.

Each of the compressive-strained layers 6a, 6b, ... and tensile-strained layers 7a, 7b, ... may, for instance, have a doping concentration of n to 5×10$^{15}$cm$^{-3}$.

The reason why the value of ΔEv is set to 15 meV is that the phenomenon of hole-piling up can be effectively prevented from occurring in the valence band by holding the value of ΔEv to be not greater than 15 meV. The thermal energy level of kT, to be 26 meV in ambient temperature.

The Schottky junction devices according to the invention are produced by e.g., MOCVD, MBE, gas source MBE method and the like, of the methods excellent in the controlling of the extremely thin films.

The turn at the valence band edge of the superlattice of a Schottky junction device according to the invention may show a continuously graded or curved profile.

When a multiple quantum barrier layer as disclosed in Reference Document 4 is used for the superlattice of a device according to the invention, the compositions or the materials of the layers need to be modified and made to be same as those of the above embodiment.

The Schottky junction technology as disclosed in this patent specification may be used not only on InP substrates but also on GaAs substrates.

Additionally, the technology as disclosed in this patent specification may be applied not only to Schottky diodes (including photodiodes) but also to SIS-type FETs and HEMTs.

Advantages of the Invention

Since a Schottky junction device having a Schottky junction between a semiconductor and a metal and a superlattice on the interface between the semiconductor and the metal is characterized in that the upper end of the valence band of said superlattice is varied gradually to show a turn to a specific direction, the phenomenon of piled-up holes at the upper end of the valence band is avoided while maintaining the height of the Schottky barrier. Consequently, such a Schottky junction device shows an excellent high speed performance.

What is claimed is:

1. A Schottky junction device having a Schottky junction of a semiconductor and a metal and a superlattice at the interface of the semiconductor and the metal characterized in that the upper edge of the valence band of said superlattice is varied gradually to show a turn to a specific direction, and wherein compositional ratios of adjoining barriers and adjoining well layers are different from each other.

2. A Schottky junction device according to claim 1 characterized in that the upper edge of the valence band of the superlattice is varied gradually to show a stepped profile.

3. A Schottky junction device according to claim 1 characterized in that the upper edge of the valence band of the superlattice is varied gradually to show a continuous profile.

4. A Schottky junction device according to claim 1 characterized in that the upper edge of the valence band of the superlattice is varied to show a curved profile.

5. A Schottky junction device according to claim 1 wherein the superlattice is formed by growing tensile-strained layers and compressive-strained layers and consists of tensile-strained layers and compressive-strained layers.

6. A Schottky junction device according to claim 1, wherein the superlattice is a multiquantum barrier formed on an InP substrate and the tensile-strained layers of the multiquantum barrier includes GaInAs, whereas the compressive-strained layers of the multiquantum barrier includes AlInAs.

7. A Schottky junction device according to claim 1, wherein the superlattice is a multiquantum barrier formed on an InP substrate and the tensile-strained layers of the multiquantum barrier includes GaAsSb, whereas the compressive-strained layers of the multiquantum barrier includes AlInAs.

* * * * *